United States Patent
Lee et al.

(10) Patent No.: US 9,972,592 B2
(45) Date of Patent: May 15, 2018

(54) BUMPED LAND GRID ARRAY

(71) Applicant: Avago Technologies General IP (Singapore) Pte. Ltd., Singapore (SG)

(72) Inventors: Ah Ron Lee, Seoul (KR); Deog Soon Choi, Seoul (KR); Hyun-Mo Ku, Seoul (KR)

(73) Assignee: AVAGO TECHNOLOGIES GENERAL IP (SINGAPORE) PTE. LTD., Singapore (SG)

( * ) Notice: Subject to any disclaimer, the term of this patent is extended or adjusted under 35 U.S.C. 154(b) by 0 days. days.

(21) Appl. No.: 15/200,943

(22) Filed: Jul. 1, 2016

(65) Prior Publication Data

US 2018/0005971 A1  Jan. 4, 2018

(51) Int. Cl.
| | | |
|---|---|---|
| *H01L 23/498* | (2006.01) | |
| *H01L 23/00* | (2006.01) | |
| *H01L 23/29* | (2006.01) | |
| *H05K 1/02* | (2006.01) | |
| *H01L 23/31* | (2006.01) | |
| *H01L 21/78* | (2006.01) | |

(52) U.S. Cl.
CPC .............. *H01L 24/14* (2013.01); *H01L 21/78* (2013.01); *H01L 23/293* (2013.01); *H01L 23/3128* (2013.01); *H01L 24/03* (2013.01); *H01L 24/05* (2013.01); *H01L 24/11* (2013.01); *H05K 1/0296* (2013.01); *H01L 2224/0401* (2013.01); *H01L 2224/171* (2013.01); *H01L 2224/1713* (2013.01); *H01L 2224/1714* (2013.01); *H01L 2224/80024* (2013.01); *H01L 2224/81815* (2013.01); *H01L 2924/15323* (2013.01); *H05K 2201/10719* (2013.01)

(58) Field of Classification Search
CPC ... H01L 23/49816; H01L 24/26; H01L 24/29; H01L 24/30
See application file for complete search history.

(56) References Cited

U.S. PATENT DOCUMENTS

| | | | |
|---|---|---|---|
| 6,784,089 | B2 | 8/2004 | Lei et al. |
| 9,299,606 | B2 | 3/2016 | Aoki et al. |
| 2009/0042382 | A1 | 2/2009 | Hawkey |
| 2012/0243147 | A1 | 9/2012 | Marconi et al. |
| 2012/0261812 | A1* | 10/2012 | Topacio ............... H01L 24/03 257/737 |
| 2015/0115456 | A1* | 4/2015 | Scanlan ............... H01L 21/56 257/773 |
| 2016/0044786 | A1* | 2/2016 | Swaminathan ..... H01L 23/5381 174/257 |

\* cited by examiner

*Primary Examiner* — Jae Lee
(74) *Attorney, Agent, or Firm* — Sheridan Ross P.C.

(57) ABSTRACT

A semiconductor package and methods for producing the same are described. One example of the semiconductor package is described to include a substrate having a first face and an opposing second face. The package is further described to include a plurality of solderable surfaces formed on the first face of the substrate, a first solderable surface in the plurality of solderable surfaces having a pattern plating structure on an outward facing surface of the first solderable surface. There may also be an amount of solder bonded to the outward facing surface of the first solderable surface, where the pattern plating structure on the outward facing surface of the first solderable surface causes the amount of solder to have a first thickness at its ends, a second thickness at its center, and a discrete transition between the first thickness and the second thickness.

20 Claims, 10 Drawing Sheets

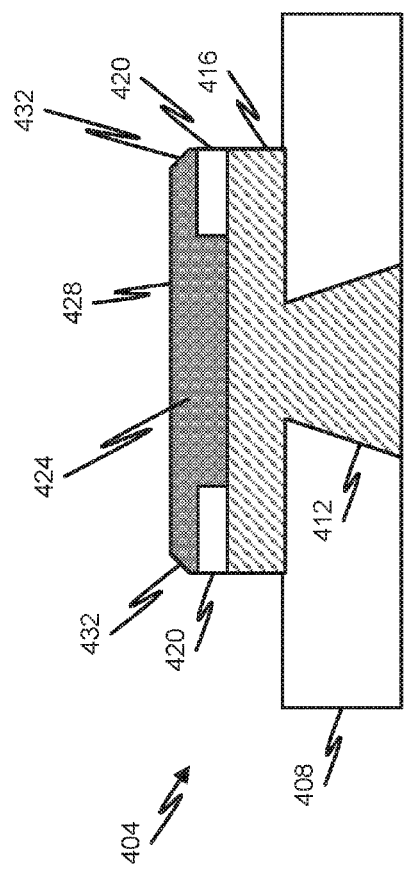
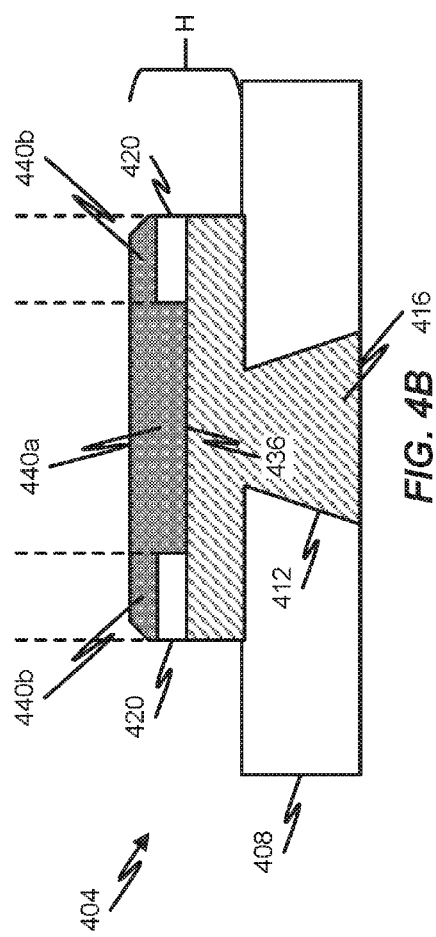

BUMPED LAND GRID ARRAY

FIELD OF THE DISCLOSURE

The present disclosure is generally directed toward computing devices and the semiconductor packages used thereby.

BACKGROUND

Electronic devices such as integrated circuits and passive electronic devices are packaged in a variety of configurations. One known configuration involves the formation of a solder ball array on the exterior of the package to provide electrical communication between the package device and other components such as a Printed Circuit Board (PCB) or test socket. In such solder ball packaging, a series of solder balls are adhered to conductive leads from the packaged device and spatially arranged in an array (e.g., a grid of perpendicular rows and columns) with a solder ball at the column and row intersections.

Methods for mounting chips and other semiconductor packages on substrates known as flip-chip techniques," in which the bottom surface of a die and a substrate are connected via bumps arranged in the form of an array, are conventionally well-known.

BRIEF DESCRIPTION OF THE DRAWINGS

The present disclosure is described in conjunction with the appended figures:

FIG. 4A is a cross-sectional view of a portion of a semiconductor package in accordance with at least some embodiments of the present disclosure;

FIG. 4B is a cross-sectional view of the semiconductor package from FIG. 4A with a further depiction of various dimensions;

DETAILED DESCRIPTION

Figure 1:
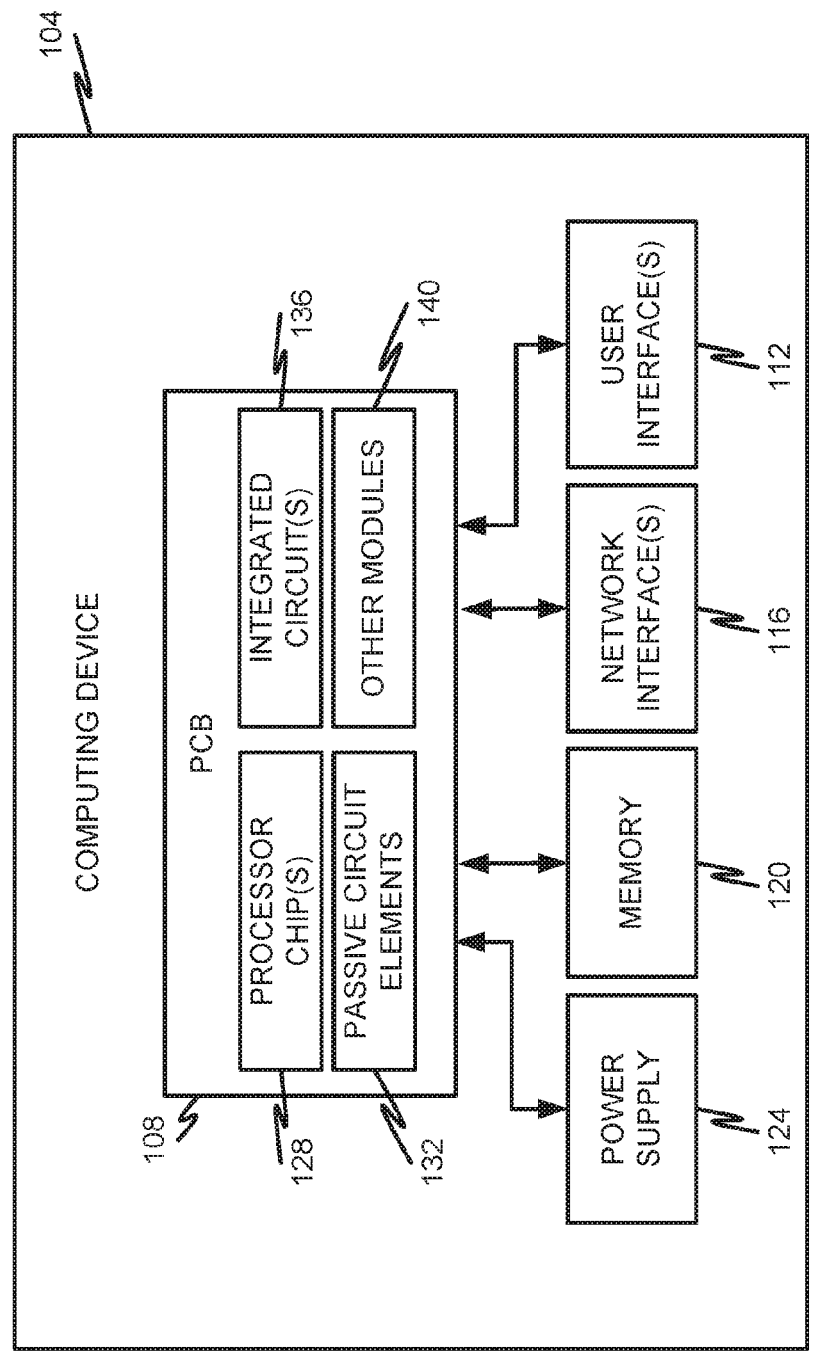
FIG. 1 is a block diagram depicting components of a computing device in accordance with at least some embodiments of the present disclosure.

Various aspects of the present disclosure will be described herein with reference to drawings that are schematic illustrations of idealized configurations. As such, variations from the shapes of the illustrations as a result, for example, manufacturing techniques and/or tolerances, are to be expected. Thus, the various aspects of the present disclosure presented throughout this document should not be construed as limited to the particular shapes of elements (e.g., regions, components, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another—although some features or elements may exhibit discrete changes as well. Thus, the elements illustrated in the drawings are schematic in nature and their shapes are not intended to be limited to the precise shape of an element and are not intended to limit the scope of the present disclosure.

It will be understood that when an element such as a region, component, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" or "established" on another element, it can be grown, deposited, etched, attached, connected, coupled, or otherwise prepared or fabricated on the other element or an intervening element.

Furthermore, relative terms, such as "lower" or "bottom" and "upper" or "top" may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described as being on the "lower" side of other elements would then be oriented on the "upper" side of the other elements. The term "lower" can, therefore, encompass both an orientation of "lower" and "upper" depending of the particular orientation of the apparatus. Similarly, if an apparatus in the drawing is turned over, elements described as "below" or "beneath" other elements would then be oriented "above" the other elements. The terms "below" or "beneath" can therefore encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

It is with respect to the above-noted shortcomings of the prior art that the features disclosed herein were contemplated. In particular, solutions are proposed to apply solder material (e.g., solder bumps) on a Land Grid Array (LGA) to compensate for insufficient solder volume during the board level assembly. One aspect of a bumped LGA as proposed herein is the co-planarity and uniform solder volume that can be achieved, thereby providing a secure and stable solder joint. Thus, a stable bumped LGA is proposed herein, among other things.

With reference initially to a FIG. 1, an environment in which embodiments of the present disclosure can be utilized will be described. FIG. 1 depicts a computing device 104 having a Printed Circuit Board (PCB) 108 and a number of other components incorporated therein. The computing device 104 may correspond to any type of known device capable of performing analog and/or digital computing tasks. Examples of a computing device 104 include, without limitation, a Personal Computer (PC), laptop, tablet, cellular phone, smartphone, telephone, handheld video game console, Personal Digital Assistant (PDA), wearable device (e.g., smart watch, dedicated wearable device, wearable healthcare device, body monitoring equipment, etc.), and the like.

The computing device 104 is shown to include the PCB 108, user interface(s) 112, network interface(s) 116, computer memory 120, and a power supply 124. The PCB 108 is further shown to have one or more processor chips 128, integrated circuit 136, passive circuit element 132, and other modules 140 mounted thereon. The elements provided on the PCB 108 may be both physically attached to the PCB 108 and in electrical communication with the PCB 108. In some embodiments, the elements provided on the PCB 108 may be mounted to the PCB 108 using either Surface Mount Technologies (SMT) or thru-hole mount technologies that facilitate a physical and electrical connection between the elements and the PCB 108. Advantageously, the PCB 108 may also comprise electrical traces or circuit paths that enable electronic communications between the various elements mounted thereon as well as between the other components of the computing device 104. Although the interface(s) 112, network interface(s) 116, memory 120, and power supply 124 are shown as being separate from the PCB 108, it should be appreciated that these elements may also be mounted on the PCB 108.

The user interface(s) 112 may include one or more user input devices and/or one or more user output devices. Examples of suitable user input devices that may be included in the user interface(s) 112 include, without limitation, buttons, keyboards, mouse, touch-sensitive surfaces, pen, camera, microphone, etc. Examples of suitable user output devices that may be included in the user interface(s) 112 include, without limitation, display screens, touchscreens, lights, speakers, etc. It should be appreciated that the user interface 112 may also include a combined user input and user output device, such as a touch-sensitive display or the like.

The network interface(s) 116 may include hardware that facilitates communications with other communication devices over a communication network (e.g., a wireless or wired communication network). Accordingly, the network interface 116 may include an Ethernet port, a Wi-Fi card, a Network Interface Card (NIC), a cellular interface (e.g., antenna, filters, and associated circuitry), or the like. The network interface 116 may be configured to facilitate a connection between the computing device 104 and a communication network (e.g., cellular network, Local Area Network (LAN), wireless network (e.g., 802.11N network), etc.) and may further be configured to encode and decode communications (e.g., packets) according to a protocol utilized by the communication network. It should be appreciated that some aspects of the network interface 116 may actually be executed on a processor chip 128 or integrated circuit 136 (e.g., filtering functions, encoding/decoding functions, amplification functions), which means that the network interface 116 may correspond to the physical device(s) that facilitate network communications (e.g., antennas, network ports, etc.).

The memory 120 may correspond to any type of non-transitory computer-readable medium. In some embodiments, the memory 120 may comprise volatile or non-volatile memory and a controller for the same. Non-limiting examples of memory 120 that may be utilized in the computing device 104 include RAM, ROM, buffer memory, flash memory, solid-state memory, hard disk drives, or variants thereof.

The power supply 124 may include a built-in power supply (e.g., battery) and/or a power converter that facilitates the conversion of externally-supplied AC power into DC power that is used to power the various components of the computing device 104. In some embodiments, the power supply 124 may also include some implementation of surge protection circuitry to protect the components of the computing device from power surges.

The processor chip(s) 128 may correspond to one or many microprocessors that are used to execute instructions stored in memory 120 and in other locations. The processor chip(s) 128 may correspond to any type of known digital or analog processing device that enables the computing device 104 to execute some or all of its desired functions. In some embodiments, the processor chip 128 incorporates the functions of the computing device's Central Processing Unit (CPU) on a single Integrated Circuit (IC) or a few IC chips. The processor chip 128 may be a multipurpose, programmable device that accepts digital data as input, processes the digital data according to instructions stored in its internal memory, and provides results as output. The processor chip 128 may also implement sequential digital logic as it has internal memory. As with most known microprocessors, the processor chip 128 may operate on numbers and symbols represented in the binary numeral system.

The integrated circuit 136 may be similar or identical to the processor chip(s) 128, in that they may comprise a number of integrated circuit elements in a single package. Whereas the processor chip(s) 128 may execute high-level functions on behalf of the computing device 104, the integrated circuit(s) 136 may be used to execute more specific or low-level functions within the computing device 104. It should be appreciated, however, that the functions of the processor chip(s) 128 and integrated circuit(s) 136 may be combined into a single integrated circuit or chip package without departing from the scope of the present disclosure. In some embodiments, the integrated circuit(s) 136 may be configured to execute driver functions or other specific functions on behalf of certain components of the computing device 104. For instance, an integrated circuit 136 may be provided to facilitate the operation of the network interface 116. Such an integrated circuit 136 may perform the desired encoding/decoding functions, filtering functions, and other basic functions required to enable the network interface 116 to perform as desired.

The passive circuit elements 132 may correspond to known types of circuit elements that are connected to the PCB 108. Non-limiting examples of passive circuit elements 132 that may be connected to the PCB 108 include resistors, capacitors, inductors, diodes, transducers, sensors, detectors, and the like.

Figure 2:
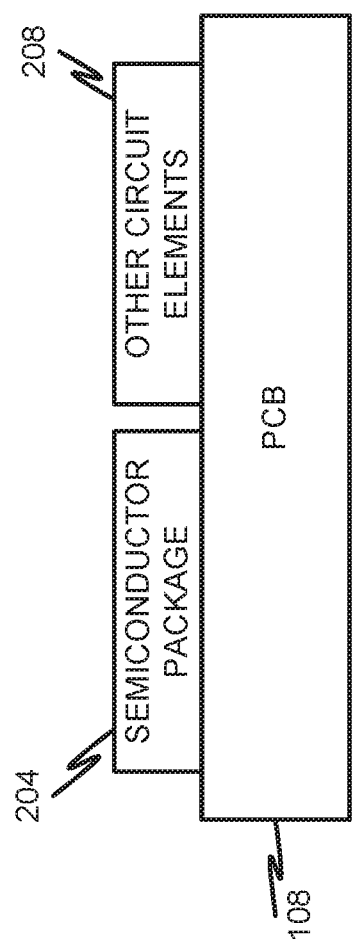
FIG. 2 is a block diagram depicting a PCB with components mounted thereon in accordance with at least some embodiments of the present disclosure.

The other modules 140 may include any other type of component that is connected to the PCB 108 and in electrical communication with other elements of the PCB 108. Other modules 140 may include speakers, buzzers, transformers, amplifiers, and the like As can be seen in FIG. 2, the PCB 108 may provide a physical support for semiconductor packages 204 and other circuit elements 208. The semiconductor package 204 may include any of the processor chips(s) 128, the integrated circuit(s) 136, or any other device mounted on the PCB 108 that comprises a package of circuit elements contained in a single package. The other circuit elements 208 may include the passive circuit elements 132 and other modules 140 that are mounted on the PCB 108. In addition to providing a physical support for the semiconductor package(s) 204 and other circuit elements 208, the PCB 108 may also provide electrical connectivity between the devices 204, 208. The electrical connectivity may be provided via electrically-conductive traces, wires, or combinations thereof. The material of the PCB 108 may be rigid or flexible as is known in the art. It should further be appreciated that the semiconductor package 204 and/or other circuit elements 208 may be mounted on the PCB 108 using SMT techniques, thru-hole mounting, or flip-chip techniques. As will be described in further detail herein, one or more of the semiconductor packages 204 may be mounted on the PCB 108 using flip-chip techniques by providing the semiconductor packages 204 with an array of solder bumps formed thereon (e.g., as an LGA configuration). Ball Grid Arrays or other types of solder arrays may also be used without departing from the scope of the present disclosure.

Figure 3:
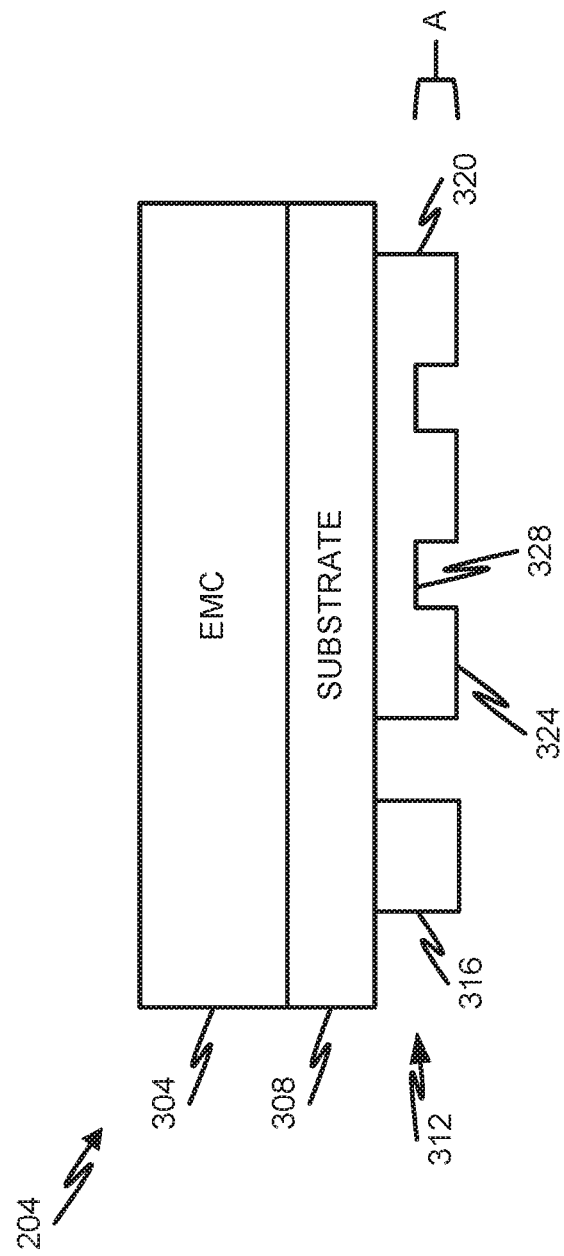
FIG. 3 is a block diagram depicting components of a semiconductor package in accordance with at least some embodiments of the present disclosure.

With reference now to FIG. 3, additional structural elements of a semiconductor package 204 are shown in accordance with at least some embodiments of the present disclosure. The semiconductor package 204 is shown to include a package body 304, a substrate 308, and a plurality of solderable surfaces 312. The semiconductor package 204 is shown with the plurality of solderable surfaces 312 facing downward, which may correspond to an orientation in which the package 204 is mounted onto the PCB 108. It should be appreciated, however, that the orientation depicted in FIG. 3 should not be construed as limiting. In fact, the package 204 is likely constructed (at least during certain phases of production) with the plurality of solderable surfaces 312 facing upward and the package body 304 positioned beneath the substrate 308. Thus, even though the plurality of solderable surfaces 312 are shown as being positioned beneath the substrate 308, it should be appreciated that the plurality of solderable surfaces 312 may be said to be mounted "on top" or "on" the substrate 308—even in the configuration depicted in FIG. 3.

The package body 304 may comprise a plastic or molded compound that protects the internal components of the package 204. In some embodiments, the package body 304 may correspond to a type of dielectric or non-conductive material that helps to protect the internal components of the package 304 from environmental conditions and/or external electrical charges.

The substrate 308 may comprise a dielectric material or similar non-conductive material used for physically supporting the plurality of solderable surfaces 312. The substrate 308 may further comprise one or more electrically-conductive vias, electrically-conductive traces, and other components that enable various components mounted to the substrate 308 to communicate with one another. In general, it is desirable to utilize an electrically insulative material for the substrate 308.

The plurality of solderable surfaces 312 are shown to include at least one LGA pad 316 and a set of LGA pads 320. It should be appreciated that the plurality of solderable surfaces may comprise a large number of LGA pads 316, 320 distributed across the substrate 308 in a uniform or matrix configuration. It should also be appreciated that the LGA pads 316, 320 do not necessarily need to be configured in a uniform array or organized matrix of pads. To the contrary, the LGA pads 316, 320 may be distributed across the substrate 308 in any configuration—organized or unorganized.

In some embodiments, the LGA pad 316 is used to provide a single physical and electrical connection to an electrical node on a PCB 108. The set of LGA pads 320 may correspond to a ground node or some other common potential node where multiple pads in the set of LGA pads 320 are electrically connected to one another with negligible or zero resistance. It should be appreciated that each pad in the set of LGA pads 320 may physically connect to a different electrical node on the PCB 108 to provide a common voltage to different nodes on the PCB 108. It should also be appreciated that each pad in the set of LGA pads 320 is designed to be substantially co-planar with any other LGA pad 316 on the substrate 308. Thus, the plurality of LGA pads 312 provided on the substrate 308 may have substantially the same height as measured from the top of the substrate 308 to the top of the LGA pad 316, 320. Such co-planarity helps to enable an efficient bonding with the PCB 108.

In some embodiments, the surface tension of the flux or solder material placed on the LGA pads 320 may be leveraged to control a size of solder bumps from one pad to the next and the height variation between solder bumps can be maintained within a relatively tight tolerance by leveraging such surface tension. Additionally, when the LGA pads 320 are mounted on a flat horizontal surface (e.g., another PCB 108), the package body 304 may be viewed as having a substantially horizontal/parallel orientation with respect to the horizontal surface of the PCB 108. As a non-limiting example, the solder bump's parabolic angle may be limited to less than 1%, which can help improve chip placement yield and overall co-planarity.

Furthermore, the pads on the set of LGA pads 320 may be structured such that flux and solder material is unlikely to span between two different pads in the set of LGA pads 320. More specifically, the gap A between a top surface 324 of a pad in the set of LGA pads 320 and a bottom of a trough 328 between the pads may be between approximately 20 um and 40 um, which is approximately 5um more than normal. This dimension of gap A can help to ensure that neither flux nor solder material can bridge among the pads in the set of LGA pads 320.

With reference now to FIGS. 4A and 4B, additional details of a package portion 404 will be described in accordance with at least some embodiments of the present disclosure. The package portion 404 may correspond to a piece or part of a semiconductor package 204. In particular, the portion 404 may correspond to a close-up view of either the LGA pad 316 or a pad in the set of LGA pads 320.

The package portion 404 shows the substrate 408 with a via 412 provided therethrough. The substrate 408 may be the same or similar to substrate 308. The substrate via 412 may provide a way for allowing the pad 416 to travel through the substrate 412. This enables electrical signals to be carried between the pad 416 and other components mounted on the opposing side of the substrate 408.

As shown in FIG. 4A, the substrate via 412 does not necessarily have to be uniform in width. Rather, the substrate via 412 may exhibit a conical or frustro-conical configuration that helps to ensure the pad 416 is properly seated and secured to the substrate 408. The pad 416 may extend perpendicularly away from the surface of the substrate 408 to create a physical separation between the surface of the substrate 408 and the outward facing surface of the pad 416—this helps to enable connectivity with the PCB 108. Although depicted as having substantially perpendicular edges, the pad 416 does not necessarily need to be configured in such a way. Rather, the pad 416 may be configured to have its edges extend from the surface of the substrate 408 at an acute or obtuse angle.

The outward facing surface of the pad 416 is shown to be substantially perpendicular to the major or outward facing surface of the substrate 408. The outward facing surface of the pad 416 is also shown to have a width that is greater than a width of the substrate via 412. The outward facing surface of the pad 416 may be configured to receive an amount of solder material 424 thereon. The amount of solder material 424 may be deposited or provided on the outward facing surface of the pad 416 in a number of different ways. Once the amount of solder material 424 is reflowed or finally processed, the solder material 424 may expose a circuit attach surface 428 that is used for connecting directly to an electrical node of the PCB 108. The circuit attach surface 428 of the solder material 424 is shown to have a substantially planar configuration. As will be discussed in further detail herein, this substantially planar circuit attach surface 428 enables the package 204 to connect with the PCB 108 even though the PCB 108 may have strict design tolerances (e.g., small spaces between electrical nodes).

The substantially planar circuit attach surface 428 of the solder material 424 is achieved by utilizing, in some embodiments, a pattern plating structure 420 at external parts of the pad 416. More specifically, the pad 416 is shown to have one or more pattern plating structures 420 provided on its outward facing surface. The pattern plating structures 420 are shown to have their outer edges aligned with the outer edge of the pad 416. It should be appreciated, however, that the pattern plating structure 420 may be inset from the outer edges of the pad 416, thereby leaving some amount of outward facing surface of the pad 416 exposed beyond the pattern plating structure 420. The pattern plating structures 420, in some embodiments, may correspond to a single and continuous raised structure that is designed to retain some of the solder material 424 and to minimize the length of distance between the circuit attach surface 428 and the top of the pad 416. In other words, the pattern plating structure 420 may serve as an extension of the outward facing surface of the pad 416 and may help to minimize the amount of solder material 424 at the edges of the pad 416. By minimizing the amount of solder material 424 at the edges of the pad 416, the pattern plating structure 420 creates a smaller corner 432 at the top of the solder material 424 and reduces the overall surface tension across the entire circuit attach surface 428. Furthermore, unlike prior art solder bumps which exhibit a substantially parabolic shape, the shape of the solder bump resulting from embodiments of the present disclosure can be substantially co-planar/flat with respect to other solder bumps as exhibited by the substantially planar circuit attach surface 428.

By raising the edges of the pad 416 with the pattern plating structure 420, the amount of solder material 424 present at the edges of the pad 416 is significantly less than the amount of solder material 424 present over the middle of the pad 416. As can be seen in FIG. 4B, the pad 416 comprises a centralized solder retention area 436 that is surrounded (partially or completely) by the pattern plating structure(s) 420. The solder material 424 can be thought of as having a centralized portion 440a and edge solder portions 420b. The centralized solder portion 440a may reside directly over the solder retention area 436 and the edge solder portions 420b may reside directly over the pattern plating structure(s) 420. The pattern plating structure 420, in some embodiments, is designed such that there is a discrete transition between the centralized solder portion 440a and the edge solder portions 420b. In other words, a thickness of the centralized solder portion 440a may be equal to a thickness of the edge solder portions 440b plus a height of the pattern plating structure 420 (except at the corners 432 of the solder material 424). Furthermore, the centralized solder portion 440a may have a substantially uniform thickness across the entirety of the centralized solder retention area 436. The solder retention area 436 may also be considered a type of solder retention cavity that resides between the pattern plating structures 420. Most of the solder material 424 may reside in the solder retention area 436 (e.g., at least 80%) and a lesser amount of the solder material 424 may reside over the pattern plating structures (e.g., no more than 20%) even though the relative surface area of the solder retention area 436 is not proportionately sized with respect to the tops of the pattern plating structures 420.

As discussed above, the pattern plating structures 420 help to form a substantially planar circuit attach surface 428 on the reflowed solder material 424. The ultimate shape of the circuit attach surface 428 is due, at least in part, due to surface tension in a liquefied solder material 424. The pattern plating structure 420 helps minimize the surface tension in the liquefied solder material 424 by easing the transition at the edge solder portions 440b. Perhaps unexpectedly, the addition of the pattern plating structure 420 to the top of the pad 416 decreases the overall final pad height H as compared to LGA pads that do not include a pattern plating structure. For instance, the final pad height H may be between 35 um and 30 um. It is somewhat counterintuitive that increasing the pattern plating structure 420 height can help reduce the overall package height. Furthermore, utilization of the pattern plating structure 420 helps ensure that the solder material 424 does not flow off the tops of the pads 416, which could accidentally lead to short circuits or other device failures.

It should be appreciated that the surface tension of the liquefied solder material 424 may depend upon the type of solder material 424 utilized. In some embodiments, the solder material 424 may correspond to a solder paste, a conductive epoxy, or some other conductive liquid material. Alternatively or additionally, the solder material 424 may be formed using solder balls (one or a plurality). The solder material 424 may be deposited directly on the outward facing surface of the pad 416 or a flux material may be used to help the adhesion of the solder material 424 to the pad 416. It should be appreciated that any type of electrically conductive material or combination of materials may be used as part of the solder material 424.

Figure 5A:
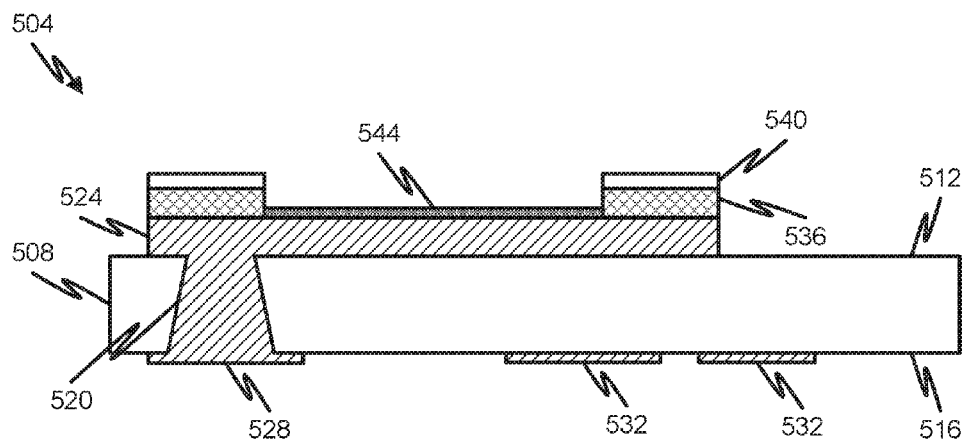
FIG. 5A is a cross-sectional view of a portion of another semiconductor package in accordance with at least some embodiments of the present disclosure.
Figure 5B:
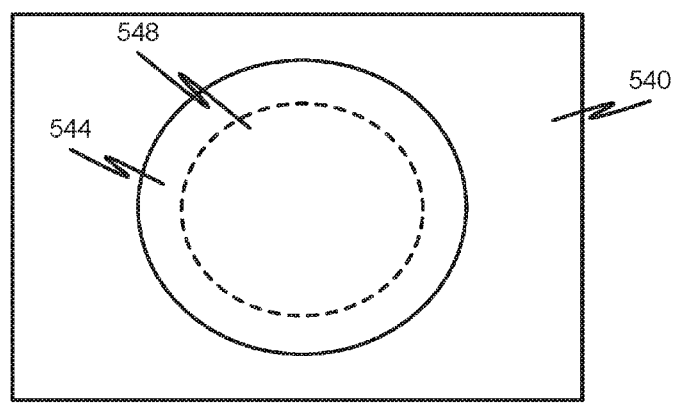
FIG. 5B is a top view of the pad depicted in FIG. 5B.

With reference now to FIGS. 5A and 5B, additional details of another possible configuration of a package portion 504 will be described in accordance with at least some embodiments of the present disclosure. The package portion 504 may be similar or identical to the package portion 404 and may be part of a semiconductor package 204. As a non-limiting example, the package portion 504 may be included as part of an LGA pad 316 or a pad in the set of LGA pads 320. Furthermore, any features described in connection with package portion 404 may be exhibited or possessed by package portion 504, and vice versa.

The package portion 504 is shown to include a substrate 508 with a substrate 520 extending therethrough. The substrate 520 is shown to have a first surface 512 and a second surface 516 that opposes the first surface 516. The first surface 512 may be considered an outward facing surface of the substrate 508. Moreover, the features of the substrate 508 may be similar or identical to features of substrate 308 and/or 408.

FIG. 5A further shows that the substrate via 520 extends from the first surface 512 to the second surface 516. In addition, an exposed portion 528 of the pad is slightly raised relative to the second surface 516 of the substrate 508. In some embodiments, additional metal portions 532 are provided on the second surface 516 of the substrate 508. The exposed portion 528 and metal portions 532 may correspond to electrical traces or other mechanisms for carrying electrical current within the package.

The pad of FIG. 5A is slightly different from the pad of FIGS. 4A and 4B in that the pad of FIG. 5A is not centered over the substrate 520, but rather extends across the first surface 512 of the substrate 508 away from the substrate 520. The pad is similar to the other pads depicted and described herein in that the pad is provided with a pattern plating structure or similar solder retaining wall that helps contain the solder material at the center of the pad. The detailed view in FIG. 5A further shows the different layers of materials that may be included in the pad. It should be appreciated that these layers and material types may be used in the other pads and pattern plating structures described herein without departing from the scope of the present disclosure. In some embodiments, the pad comprises a first pad material 524 that constitutes a majority of the pad. The first pad material 524 may correspond to any type of electrically conductive material. Suitable examples of the first pad material 524 include, without limitation, copper, silver, gold, and the like. In some embodiments, the thickness of the first pad material 524 when measured from the top of the first pad material 524 to the first surface 512 of the substrate 508 may be between 18 um and 25 um and, more specifically, approximately 22 um.

The pattern plating structure is shown to include an additional pad material 536 as well as a pad cap material 540. The additional pad material 536 may be formed around the outer edges of the solder retention area (e.g., the central portion of the pad). Suitable examples of materials that may be used for the additional pad material 536 may include, without limitation, copper, silver, gold, and the like. In some embodiments, the same material may be used for additional pad material 536 that is used for the first pad material 524; however, the two materials may be formed or deposited in separate steps. The thickness of the additional pad material 536 may range between 10 um and 20 um and, more specifically, may be approximately 15 um.

The footprint of the pattern plating structure on the pad may be defined by the shape of the additional pad material 536. As will be discussed in further detail herein, the footprint or shape of the solder retention area on the pad may be dictated (partially or completely) by the shape of the additional pad material (e.g., the pattern plating structure). The footprint or shape of the solder retention area may have any desired shape or size when viewed from the top.

FIG. 5B shows one example solder retention area shape (e.g., a circular shape) that can be employed in accordance with at least some embodiments of the present disclosure. The solder retention area when viewed from the top may have other shapes, such a oval, elliptical, rectangular, polygonal, square, triangular, or any other regular or irregular shape. The top of the pattern plating structure may be covered with the pad cap material 540. In some embodiments, the pad cap material 540 covers the entirety of the pad with the exception of the solder retention area. Suitable examples of materials that may be used for the pad cap material 540 include, without limitation, gold, solver, aluminum, or copper. In a more specific, but non-limiting embodiment, the first pad material 524 may comprise copper, the additional pad material 536 may comprise copper, and the pad cap material 540 may comprise gold. These various materials may be deposited or formed on the first surface 512 of the dielectric substrate 508 using known semiconductor manufacturing techniques.

In some embodiments, the solder retention area between the pattern plating structure may be lined or covered with an organic solder preservative layer 544. The organic solder preservative layer 544 may partially or completely cover the solder retention area and may help with an adhesion between the materials of the pad and the solder material. As shown in FIG. 5B, another example of a solder material 548 that may be used is a solder ball instead of a solder paste. The solder ball 548 may be placed at an approximate center of the solder retention area and then may be reflowed to achieve the substantially planar circuit attach surface.

Figure 6A:
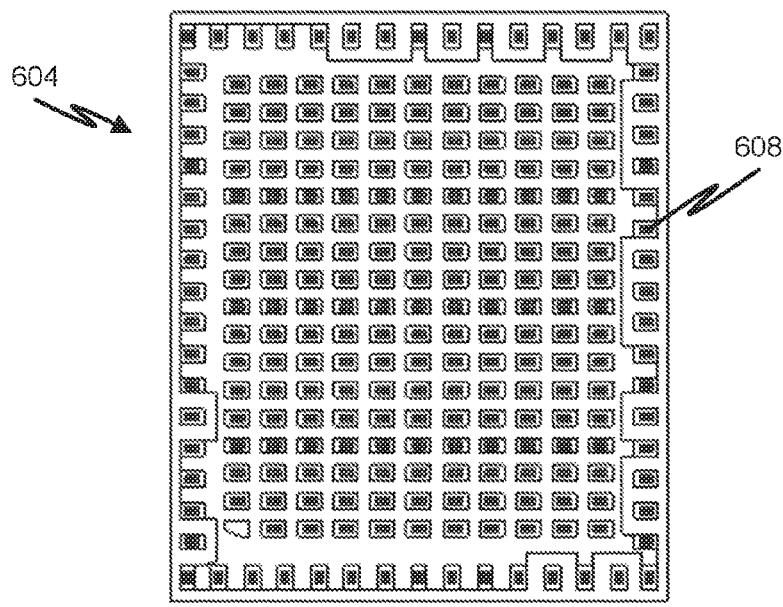
FIG. 6A is a plan view of a semiconductor package having a first pocket configuration in accordance with at least some embodiments of the present disclosure.
Figure 6B:
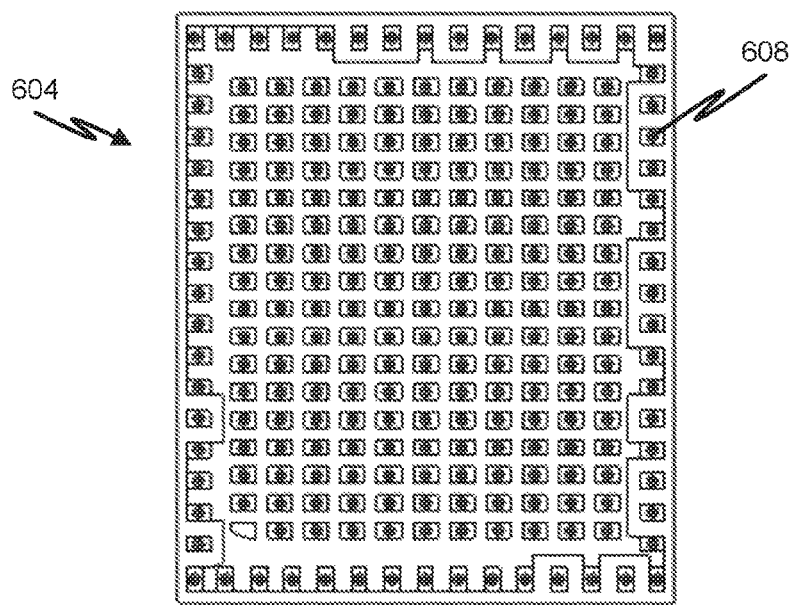
FIG. 6B is a plan view of a semiconductor package having a second pocket configuration in accordance with at least some embodiments of the present disclosure.

With reference now to FIGS. 6A and 6B, additional details of the types of shapes or configurations that may be used for the pattern plating structure (and consequently the solder retention area or solder pocket 608) will be described in accordance with at least some embodiments of the present disclosure. In the example of FIG. 6A, a semiconductor package 604 is shown to have a plurality of solderable surfaces in the form of an LGA. Each solder pocket formed on each pad in the LGA is depicted as having a substantially rectangular shape. The shape of each solder pocket is achieved by the formation of the pattern plating structure on each pad. Although the pattern plating structures are shown as completely and continuously surrounding the solder pocket 608 (e.g., solder retention area), it should be appreciated that non-continuous pattern plating structures may also be employed. For instance, a pattern plating structure may have a plurality of non-connected components that encircle the solder pocket 608, which leaves some amount of the pad substantially planar and without a heightened retaining structure at its edges. While such a configuration may not be desirable from the standpoint of retaining the solder material in the solder pocket 608, it should be appreciated that such a configuration may be more desirable from a manufacturing and/or cost perspective.

FIG. 6B depicts another illustrative configuration of the pattern plating structure (and consequently the solder retention area or solder pocket 608). Specifically, the solder pocket 608 of FIG. 6B is shown to be substantially circular or elliptical on each of the pads. It should be appreciated that different shapes of solder pockets 608 may be used on a single package 604 without departing from the scope of the present disclosure. More specifically, the single package 604 may have some of its solder pockets 608 exhibit a first configuration (e.g., circular or elliptical) while other solder pockets 608 exhibit a second configuration (e.g., rectangular or square).

Figure 7:
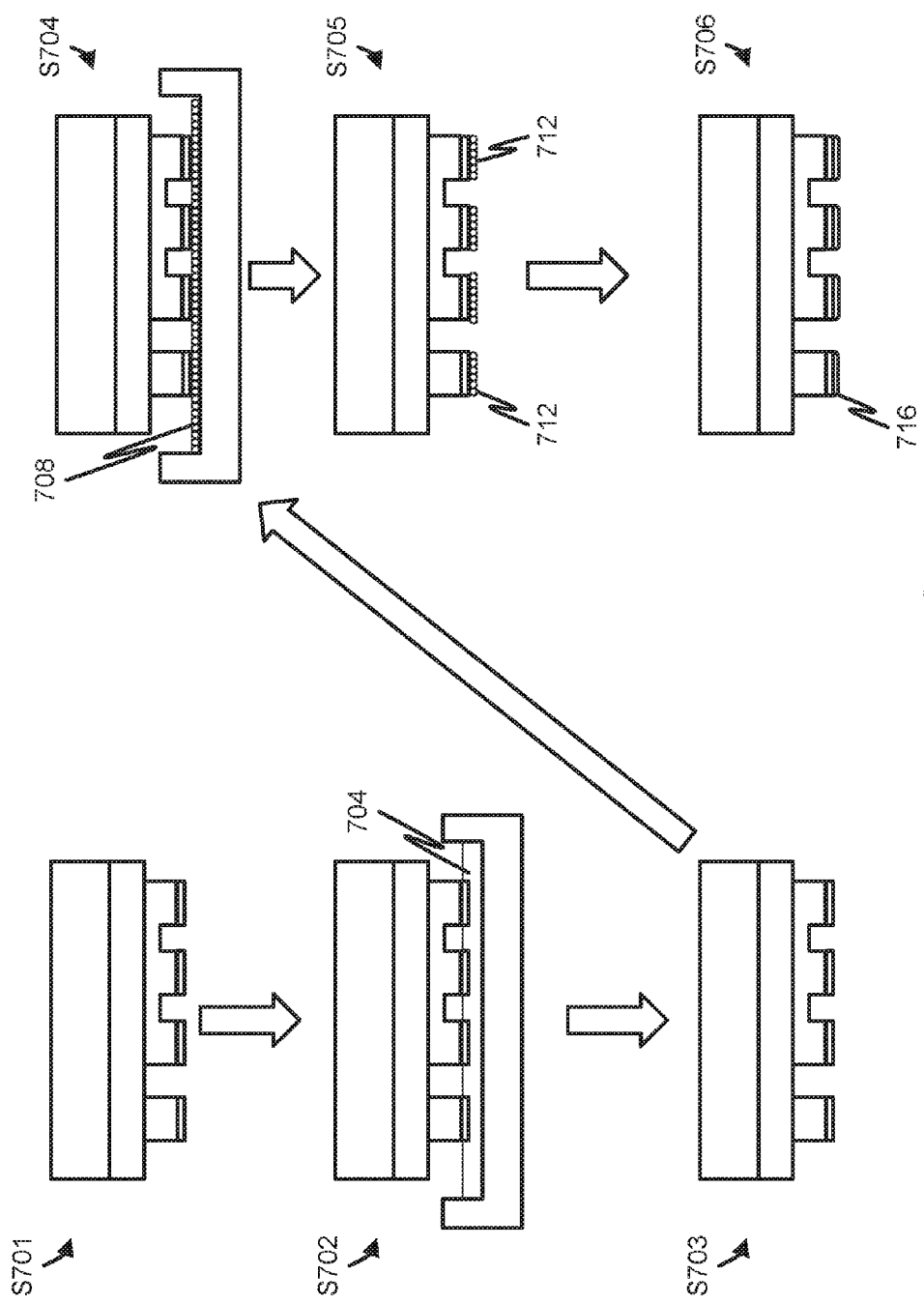
FIG. 7 depicts a first process for manufacturing a semiconductor package in accordance with at least some embodiments of the present disclosure.
Figure 8:
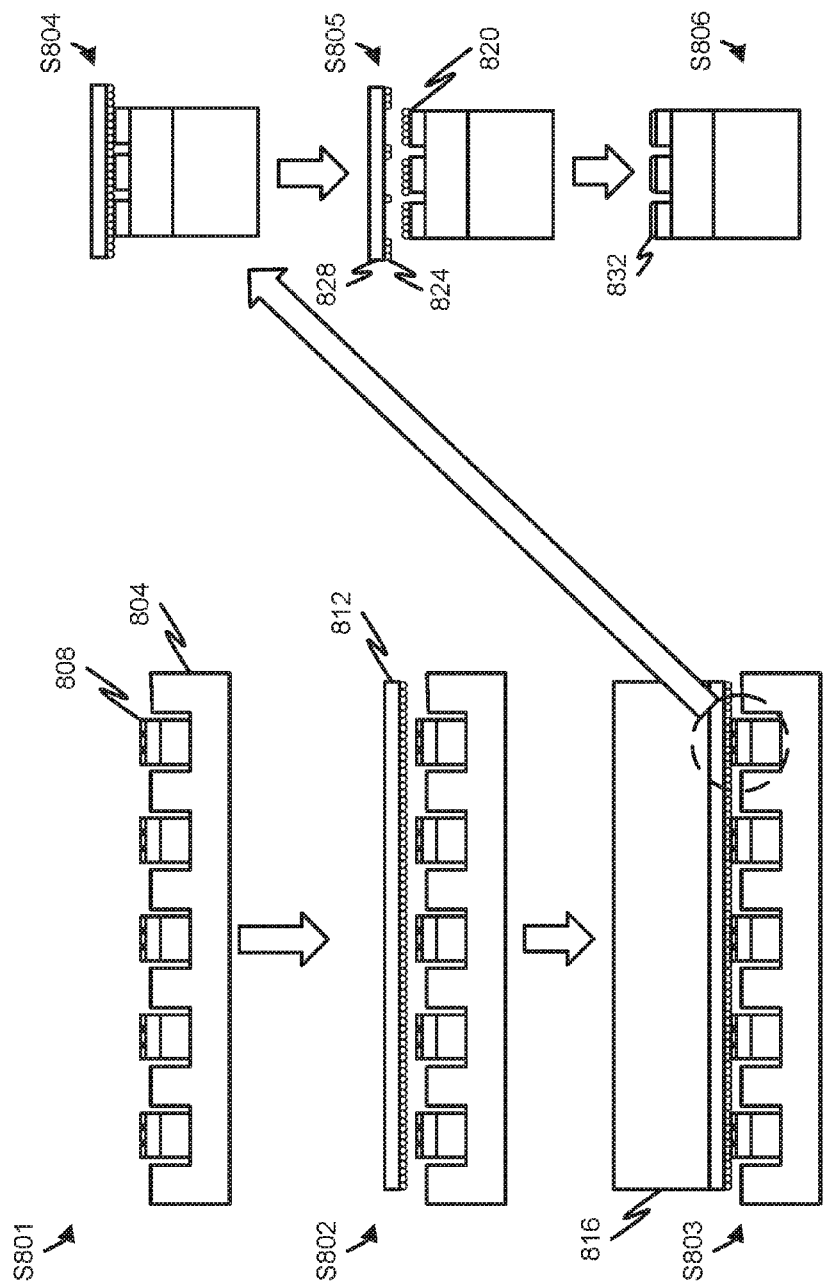
FIG. 8 depicts a second process for manufacturing a semiconductor package in accordance with at least some embodiments of the present disclosure.

With reference now to FIGS. 7 and 8, various possible processes for manufacturing a semiconductor package or portions thereof will be described in accordance with at least some embodiments of the present disclosure. It should be appreciated that any of the disclosed semiconductor packages or portions thereof may be manufacturing using some or all of the techniques described herein. In some embodiments, the disclosed manufacturing techniques help to achieve the bumped LGA with a minimal amount of solder material, which also exhibits a substantially planar circuit attach surface. It should also be appreciated that the manufacturing techniques disclosed herein are for illustrative purposes and the various steps shown herein can be performed in any order (sequentially or in parallel) without departing from the scope of the present disclosure.

FIG. 7 shows a first process for manufacturing a semiconductor package having a bumped LGA. The process starts when an individual semiconductor package is singulated from other semiconductor packages and is substantially shielded from electromagnetic influences (step S701). This step may include electrically grounding some or all of the pads in the LGA. Although the details of the pattern plating structures on each of the pads in the LGA are not shown, it should be appreciated that such features may be present.

Thereafter, the semiconductor package has its plurality of pads dipped into a flux material 704 (step S702). The flux material 704 may be retained in a liquefied state and contained with a flux dipping plate. The plurality of pads may be substantially co-planar as described herein, which makes it possible to cover all of the outward facing surfaces of the pads with only a minimal insertion of the pads into the flux material 704.

The process then continues by removing the flux dipping plate, thereby leaving the pads in the LGA with an amount of flux material provided thereon (step S703). Then a solder material 704 may be applied to the outward facing surfaces of the pads, which still have the flux material applied thereto (step S704). The solder 704 material may be similar or identical to other examples of solder material described herein. In some embodiments, the solder material 708 comprises a plurality of solder balls or solder powder that is maintained in a solder dipping tray. Again, thanks to the substantial co-planarity of the pads in the LGA, the pads do not have to be dipped very far (e.g., beyond 5 um) into the solder material 708 to ensure the outward facing surfaces of the pads are sufficiently covered.

When the solder dipping tray is removed, an amount of retained solder material 712 adheres or sticks to the flux on the pads (step S705). The retained solder material 712 is substantially even/uniform in thickness and is evenly applied across some or all of the pads in the LGA. The retained solder material 712 may be reflowed to achieve bumps 716 on the pads (step S706). The solder bumps 716 may exhibit the substantially planar circuit attach surfaces described herein. At this point, the semiconductor package may be ready for connection to a PCB 108 or the like.

FIG. 8 shows another process for manufacturing a semiconductor package. It should be appreciated that the process steps in FIG. 8 may be used in combination with some or all of the process steps of FIG. 7 without departing from the scope of the present disclosure. The process begins when a plurality of singulated semiconductor packages 808 are placed into a mechanical jig 804 after such packages 808 have been shielded from electromagnetic influences (step S801). The jig 804 may have a solder preformed film 812 brought thereto (or the jig 804 may be moved toward the film 812) such that the plurality of pads on each of the semiconductor packages 808 nearly or actually come into contact with the solder material on the film 812 (step S802). Thereafter, a pressure applicator may be used to apply a pressure on the film 812 at a desired temperature (e.g., an increased temperature) so that the solder material on the film 812 bonds or adheres to the outward facing surfaces of the pads on each package 808 (step S803). Step S804 shows a detailed view of a single semiconductor package 808 after the heat and pressure have been applied and before the film is removed from the plurality of pads.

Some solder material 820 provided on the film 828 may bond and remain on the pads, whereas other solder material 824 may not bond to any pads and, instead, may remain with the film 828. As the film 828 is removed, the bonded solder material 820 will continue to reside on the outward facing surfaces of the pads (step S805). This temporary bonding of the solder powder may occur relatively quickly under the appropriate temperature and pressure conditions. In some embodiments, the film 828 has a highly uniform thickness of solder powder 824 provided thereon. By using a powder coated film 812 as compared to solder balls, there is less emphasis placed on precise solder ball placement for each pad. This helps to reduce manufacturing costs and time.

The remaining solder material 820 may then be reflowed to achieve the solder bumps 832 (step S806). The solder bumps 832 may be similar or identical to solder bumps 716 or any other reflowed solder material described herein. In particular, the bumps 832 may demonstrate a substantially planar circuit attach surface.

Figure 9:
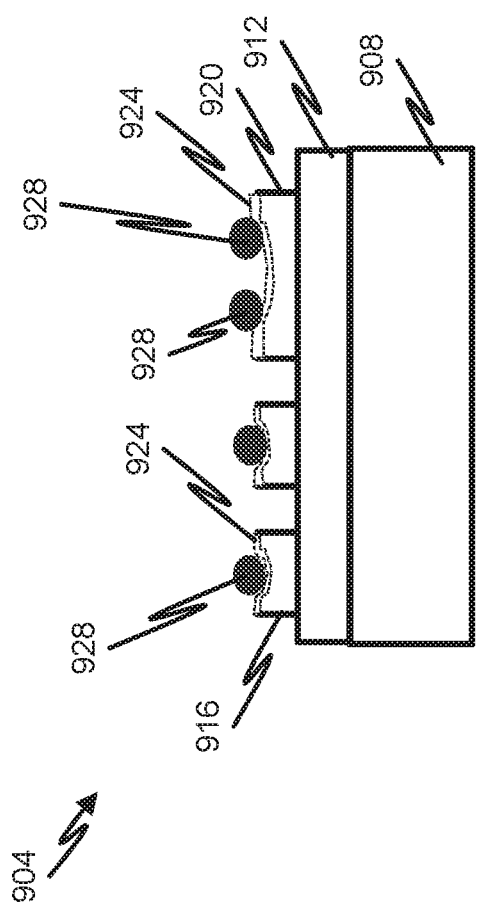
FIG. 9 is a cross-sectional view of a portion of another semiconductor package in accordance with at least some embodiments of the present disclosure.

With reference now to FIG. 9, another variation of a portion of a semiconductor package will be described in accordance with at least some embodiments of the present disclosure. A package portion 904 is shown similar to the package portions of FIGS. 4A, 4B, 5A, and 5B. The package portion 904 may be included in any of the semiconductor packages depicted and described herein.

The package portion 904 may ultimately be similar or identical to other package portions in that reflowed solder material on the plurality of LGA pads may have a substantially planar or flat circuit attach surface. The difference with the package portion 904, however, is that rather than using discretely constructed pattern plating structures, the pads on the package portion 904 have raised solder retention structures (analogous to the pattern plating structures) that transition to the solder retention area in a non-discrete or smooth manner.

The package portion 904 is shown to include a package body 908, which may be similar or identical to package body 304. The package portion 908 is also shown to include a substrate 912, which may be similar or identical to any of the substrates depicted and described herein. The LGA pads 916, 920 provided on the outward facing surface of the substrate 912 have pad surfaces 924 that transition smoothly from the edges thereof to the center solder retention portion thereof. FIG. 9 also shows that solder balls can be used as the solder material 928; however, it should be appreciated that any example of solder material may be used on the LGA pads 920. Once reflowed, the solder balls 928 may advantageously have the substantially flat or planar circuit attach surface.

The LGA pads 920 have their outer edges raised relative to the inner/center solder retention areas. In some embodiments, the LGA pads 916, 920 may be considered to have dimples or divots provided at their center. The dimples may be rounded, in some embodiments, and may be created during the manufacturing process of the LGA pads 916, 920. One function of the dimples is to create a stable solder ball placement area. As shown in FIG. 9, depending upon the size of the LGA pad 916, 920, a different number of solder balls may be provided on some of the pads and not others. Because the edges of the pads are raised, the outer edges of the reflowed solder can be raised, thereby enabling the creation of substantially planar solder bumps on the pads. The basic functionality of the dimples may be similar to the pattern plating structures except that the dimples do not create a discrete transition of solder material thickness between the center solder retention area and the edges of the pads. It should be appreciated that the size and shape of the dimples can be controlled during manufacture by controlling current power during a wet process.

Figure 10:
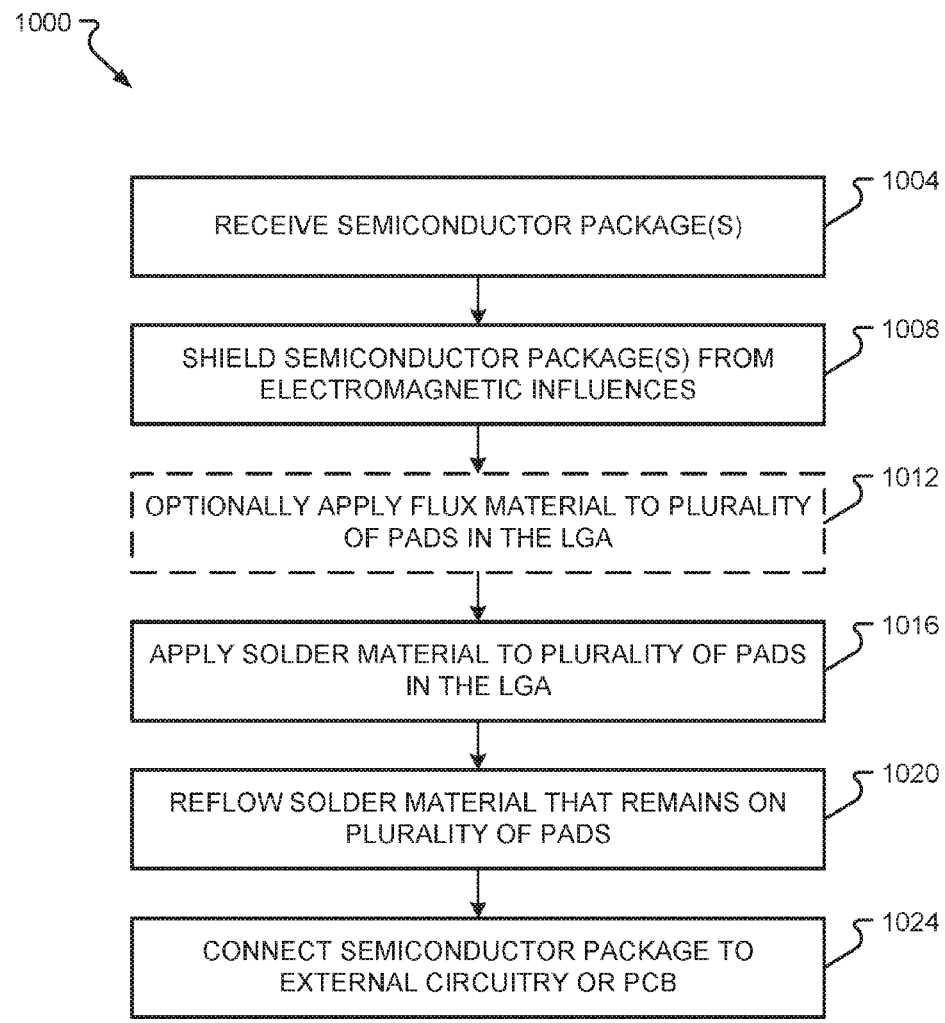
FIG. 10 is a flow chart depicting a method of manufacturing a semiconductor package in accordance with at least some embodiments of the present disclosure.

With reference now to FIG. 10, a method 1000 of manufacturing a semiconductor package will be described in accordance with at least some embodiments of the present disclosure. It should be appreciated that the steps of method 1000 can be performed in any order and they may include one or more of the process steps depicted and discussed in connection with FIGS. 7 and/or 8. Moreover, one of more of the steps depicted in FIG. 10 may correspond to optional steps or may correspond to steps that can be performed in combination with other steps.

The method 1000 begins when one or more semiconductor packages are received (step 1004). In this step, the semiconductor package(s) may correspond to any format of semiconductor package described herein or that is well known in the art. In some embodiments, the semiconductor packages may be singulated and physically separated from one another. In some embodiments, the semiconductor package(s) may be held by hand, placed on a jig, held by a conveyance mechanism, or situated on some other surface for further processing and treatment.

The method 1000 continues by shielding the semiconductor package(s) from electromagnetic interference or other unwanted sources of electrical and/or magnetic energy (step 1008). In some embodiments, this step may include grounding one or more contacts of the semiconductor package.

The method 1000 continues by optionally applying an amount of flux material to the plurality of pads on the semiconductor package(s) (step 1012). In some embodiments, the plurality of pads may belong to an LGA situated on the semiconductor package(s). It should be appreciated that the need for a flux material may depend upon the type of solder material that is being applied to the pads of the semiconductor package(s). For instance, a solder preformed film may not require that a flux material be applied to the pads, whereas other types of solder material may need a flux material applied to the pads beforehand.

The solder material is then applied to the plurality of pads (step 1016). Again, the nature of the application step may depend upon the type of solder material being used. For instance, if a liquid or semi-liquid type of solder material is employed, then the pads may be dipped into the solder material. As another non-limiting example, if the solder material is deliverable in a film format, then the film may be applied to the pads and then the film may be removed, thereby leaving an amount of solder material on the pads.

The solder material remaining on the pads may then be reflowed to form bumps on each of the pads (step 1020). The bumped LGA pads of the semiconductor package may then be utilized to connect the semiconductor package to a PCB or some other type of external circuitry (step 1024).

Specific details were given in the description to provide a thorough understanding of the embodiments. However, it will be understood by one of ordinary skill in the art that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. A semiconductor device, comprising:
a substrate comprising a first face and an opposing second face;
a plurality of solderable surfaces formed on the first face of the substrate, a first solderable surface in the plurality of solderable surfaces comprising a pattern plating structure on an outward facing surface of the first solderable surface; and
an amount of solder bonded to the outward facing surface of the first solderable surface, wherein the pattern plating structure on the outward facing surface of the first solderable surface causes the amount of solder to have a first thickness at its ends, a second thickness at its center, and a discrete transition between the first thickness and the second thickness, wherein the pattern plating structure minimizes a surface tension of the reflowed solder ball at outer ends of the LGA pad, thereby causing the reflowed solder ball to have a substantially flat top surface.

2. The semiconductor device of claim 1, wherein the pattern plating structure comprises a heightened dam that at least partially circumscribes the outward facing surface of the first solderable surface.

3. The semiconductor device of claim 1, wherein the plurality of solderable surfaces comprises a Land Grid Array (LGA) package formed on the first surface of the substrate.

4. The semiconductor device of claim 1, wherein at least 80% of the amount of solder is positioned above an area circumscribed by the pattern plating structure and wherein no more than 20% of the amount of solder is positioned over the pattern plating structure.

5. The semiconductor device of claim 1, wherein a top surface of the amount of solder is substantially planar.

6. The semiconductor device of claim 5, wherein the top surface of the amount of solder is approximately a first distance from the first face measuring from along an axis perpendicular to the first face across its entire area.

7. The semiconductor device of claim 1, wherein the pattern plating structure comprises a continuous raised structure that creates an inner cavity in a center of the outward facing surface of the first solderable surface.

8. The semiconductor device of claim 1, wherein the pattern plating structure comprises a raised structure at an outer perimeter of the outward facing surface and wherein the substrate further comprises a dielectric, the device further comprising:
an epoxy molding compound that is in direct contact with the second face of the substrate.

9. The semiconductor device of claim 1, wherein the pattern plating structure minimizes a surface tension of the amount of solder at outer ends of the outward facing surface of the first solderable surface, thereby causing the amount of solder to have a substantially flat top surface.

10. The semiconductor device of claim 1, wherein the pattern plating structure comprises a first material and wherein the plurality of solderable surfaces comprises a second material that is different from the first material.

11. The semiconductor device of claim 10, wherein the pattern plating structure further comprises the second material and wherein the first material of the pattern plating structure is formed on top of the second material of the pattern plating structure.

12. The semiconductor device of claim 10, further comprising:
an organic solder preservative layer contained within a cavity formed by the pattern plating structure, wherein the organic solder preservative layer resides between the amount of solder and the outward facing surface of the first solderable surface.

13. The semiconductor device of claim 1, wherein the pattern plating structure creates a cavity that receives the amount of solder and wherein the cavity comprises a predetermined shape.

14. The semiconductor device of claim 13, wherein the predetermined shape comprises at least one of a circle, oval, square, rectangle, triangle, and polygon.

15. The semiconductor device of claim 1, wherein the plurality of solderable surfaces comprises portions that extend through the substrate and are exposed on the second face of the substrate.

16. A system, comprising:
a body formed from an electrically insulative material;
at least one solder pad formed on an outwardly facing surface of the body;
a center solder retention area positioned on the at least one solder pad so as to receive a solder paste material; and
a raised structure surrounding the center solder retention area on the at least one solder pad such that in combination the raised structure and the center solder retention area trap a first amount of the solder paste material within the at least one solder pad and maintain a distance between the first amount of the solder paste material and the electrically insulative material of the body, wherein the first amount of the solder paste material is sufficient to form a solder bump on the at least one solder pad, wherein at least 80% of the first amount of the solder paste material is positioned over the center solder retention area and wherein no more than 20% of the first amount of the solder paste material is positioned over the raised structure.

17. The system of claim 16, wherein the raised structure in combination with the center solder retention area causes the first amount of solder paste material to have a first thickness at its ends, a second thickness at its center, and a discrete transition between the first thickness and the second thickness.

18. The system of claim 16, wherein the raised structure at least partially circumscribes the center solder retention area and wherein the at least one solder pad is part of a Land Grid Array (LGA) package.

19. The system of claim 16, wherein the raised structure minimizes a surface tension of the first amount of solder paste material positioned over the raised structure, thereby causing the first amount of solder paste material to have a substantially flat top surface.

20. A package subassembly, comprising:
a substrate comprising a first surface and opposing second surface;
a Land Grid Array (LGA) package formed on the first surface of the substrate, the LGA package comprising a plurality of LGA pads extended from the first surface of the substrate, wherein each of the plurality of LGA pads comprises a pattern plating structure formed thereon, the pattern plating structure of each LGA pad creating a bonding surface that is non-planar and raised at edges of the LGA pad; and
a solder ball placed on each of the plurality of LGA pads, wherein the pattern plating structure of the LGA pad causes the solder ball to have a first thickness at its ends, a second thickness at its center, and a discrete transition between the first thickness and the second thickness when the solder ball is reflowed on the LGA pad, wherein the pattern plating structure comprises a continuous raised structure that creates an inner cavity in a center of the LGA pad and wherein the pattern plating structure minimizes a surface tension of the reflowed solder ball at outer ends of the LGA pad, thereby causing the reflowed solder ball to have a substantially flat top surface.

* * * * *